(12) United States Patent
Wong

(10) Patent No.: US 7,070,908 B2
(45) Date of Patent: *Jul. 4, 2006

(54) FEATURE FORMATION IN THICK-FILM INKS

(75) Inventor: Marvin Glenn Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 178 days.

This patent is subject to a terminal disclaimer.

(21) Appl. No.: 10/413,854

(22) Filed: Apr. 14, 2003

(65) Prior Publication Data

US 2004/0202844 A1    Oct. 14, 2004

(51) Int. Cl.
*G03F 7/00* (2006.01)
(52) U.S. Cl. ........................ 430/311; 430/313
(58) Field of Classification Search ................ 430/198, 430/311–331
See application file for complete search history.

(56) References Cited

U.S. PATENT DOCUMENTS

| | | | |
|---|---|---|---|
| 2,312,672 A | 3/1943 | Pollard, Jr. | |
| 2,564,071 A | 8/1951 | Schilling | |
| 3,430,020 A | 2/1969 | Von Tomkewitsch et al. | |
| 3,529,268 A | 9/1970 | Rauterberg | |
| 3,600,537 A | 8/1971 | Twyford | |
| 3,639,165 A | 2/1972 | Rairden, III | |
| 3,657,647 A | 4/1972 | Beusman et al. | |
| 4,103,135 A | 7/1978 | Gomez et al. | |
| 4,200,779 A | 4/1980 | Zakurdaev et al. | |
| 4,238,748 A | 12/1980 | Goullin et al. | |
| 4,245,886 A | 1/1981 | Kolodzey et al. | |
| 4,336,570 A | 6/1982 | Brower | |
| 4,419,650 A | 12/1983 | John | |
| 4,434,337 A | 2/1984 | Becker | |
| 4,475,033 A | 10/1984 | Willemsen et al. | |
| 4,505,539 A | 3/1985 | Auracher et al. | |
| 4,582,391 A | 4/1986 | Legrand | |
| 4,628,161 A | 12/1986 | Thackrey | |
| 4,652,710 A | 3/1987 | Karnowsky et al. | |
| 4,657,339 A | 4/1987 | Fick | |
| 4,742,263 A | 5/1988 | Harnden, Jr. et al. | |
| 4,786,130 A | 11/1988 | Georgiou et al. | |
| 4,797,519 A | 1/1989 | Elenbaas | |
| 4,804,932 A | 2/1989 | Akanuma et al. | |
| 4,988,157 A | 1/1991 | Jackel et al. | |
| 5,116,271 A * | 5/1992 | Arimoto | 445/24 |
| 5,278,012 A | 1/1994 | Yamanaka et al. | |
| 5,397,518 A * | 3/1995 | Shukla et al. | 264/610 |
| 5,415,026 A | 5/1995 | Ford | |
| 5,502,781 A | 3/1996 | Li et al. | |
| 5,593,813 A | 1/1997 | Kim | |
| 5,644,676 A | 7/1997 | Blomberg et al. | |
| 5,675,310 A | 10/1997 | Wojnarowski et al. | |
| 5,677,823 A | 10/1997 | Smith | |
| 5,710,061 A * | 1/1998 | Cleeves | 438/618 |
| 5,751,074 A | 5/1998 | Prior et al. | |
| 5,751,552 A | 5/1998 | Scanlan et al. | |
| 5,828,799 A | 10/1998 | Donald | |
| 5,841,686 A | 11/1998 | Chu et al. | |
| 5,849,623 A | 12/1998 | Wojnarowski et al. | |
| 5,874,770 A | 2/1999 | Saia et al. | |
| 5,875,531 A | 3/1999 | Nellissen et al. | |
| 5,886,407 A | 3/1999 | Polese et al. | |
| 5,889,325 A | 3/1999 | Uchida et al. | |
| 5,912,606 A | 6/1999 | Nathanson et al. | |
| 5,915,050 A | 6/1999 | Russell et al. | |
| 5,972,737 A | 10/1999 | Polese et al. | |
| 5,994,750 A | 11/1999 | Yagi | |
| 6,021,048 A | 2/2000 | Smith | |
| 6,180,873 B1 | 1/2001 | Bitko | |
| 6,201,682 B1 | 3/2001 | Mooij et al. | |
| 6,207,234 B1 | 3/2001 | Jiang | |
| 6,212,308 B1 | 4/2001 | Donald | |
| 6,225,133 B1 | 5/2001 | Yamamichi et al. | |
| 6,278,541 B1 | 8/2001 | Baker | |
| 6,304,450 B1 | 10/2001 | Dibene, II et al. | |
| 6,320,994 B1 | 11/2001 | Donald et al. | |
| 6,323,447 B1 | 11/2001 | Kondoh et al. | |
| 6,351,579 B1 | 2/2002 | Early et al. | |
| 6,356,679 B1 | 3/2002 | Kapany | |
| 6,373,356 B1 | 4/2002 | Gutierrez et al. | |
| 6,396,012 B1 | 5/2002 | Bloomfield | |
| 6,396,371 B1 | 5/2002 | Streeter et al. | |
| 6,408,112 B1 | 6/2002 | Bartels | |

(Continued)

FOREIGN PATENT DOCUMENTS

EP        0593836 A1        4/1994

(Continued)

OTHER PUBLICATIONS

Marvin Glenn Wong, U.S. Appl. No. 10/137,691 (pending), "A Piezoelectrically Actuated Liquid Metal Switch", May 2, 2002.

(Continued)

*Primary Examiner*—Kathleen Duda

(57) ABSTRACT

In a method for forming one or more features in a thick-film ink deposited on a substrate, a photoimagable material is used to define a negative of the one or more features on the substrate. A thick-film ink is then deposited on at least part of the substrate, abutting at least some of the photoimagable material. The thick-film ink is cured, and the photoimagable material is removed. One embodiment of the method is used to produce a channel plate. Another embodiment of the method is used to produce a switch.

19 Claims, 4 Drawing Sheets

U.S. PATENT DOCUMENTS

| | | |
|---|---|---|
| 6,446,317 B1 | 9/2002 | Figueroa et al. |
| 6,453,086 B1 | 9/2002 | Tarazona |
| 6,470,106 B1 | 10/2002 | McClelland et al. |
| 6,487,333 B1 | 11/2002 | Fouquet |
| 6,501,354 B1 | 12/2002 | Gutierrez et al. |
| 6,512,322 B1 | 1/2003 | Fong et al. |
| 6,515,404 B1 | 2/2003 | Wong |
| 6,516,504 B1 | 2/2003 | Schaper |
| 6,559,420 B1 | 5/2003 | Zarev |
| 6,633,213 B1 | 10/2003 | Dove |
| 6,664,029 B1 * | 12/2003 | Imai et al. .................. 430/313 |
| 6,729,352 B1 * | 5/2004 | O'Connor et al. .......... 137/827 |
| 6,747,222 B1 | 6/2004 | Wong et al. |
| 2002/0037128 A1 | 3/2002 | Burger et al. |
| 2002/0146197 A1 | 10/2002 | Yong |
| 2002/0150323 A1 | 10/2002 | Nishida et al. |
| 2002/0168133 A1 | 11/2002 | Saito |
| 2003/0035611 A1 | 2/2003 | Shi |
| 2004/0112728 A1 | 6/2004 | Wong et al. |

FOREIGN PATENT DOCUMENTS

| | | | |
|---|---|---|---|
| FR | 2418539 | | 9/1979 |
| FR | 2458138 | | 12/1980 |
| FR | 2667396 | | 4/1992 |
| GB | 2397695 | | 7/2004 |
| JP | 36-18575 | | 3/1959 |
| JP | 47-21645 | | 4/1972 |
| JP | 62-276838 | | 12/1987 |
| JP | 63-294317 | | 12/1988 |
| JP | 8-125487 | | 5/1996 |
| JP | 9-161640 | | 6/1997 |
| JP | 09-190959 | * | 7/1997 |
| WO | WO99-46624 | | 9/1999 |

OTHER PUBLICATIONS

J. Simon, et al., "A Liquid-Filled Microrelay with a Moving Mercury Microdrop", Journal of Microelectromechanical Systems, vol. 6, No. 3, Sep. 1977, pp. 208-216.

TDB-ACC-NO: NB8406827, "Integral Power Resistors For Aluminum Substrate", IBM Technical Disclosure Bulletin, Jun. 1984, US, vol. 27, Issue No. 1B, p. 827.

Bhedwar, Homi C., et al. "Ceramic Multilayer Package Fabrication", Electronic Materials Handbook, Nov. 1989, pp. 460-469, vol. 1 Packaging, Section 4: Packages.

* cited by examiner

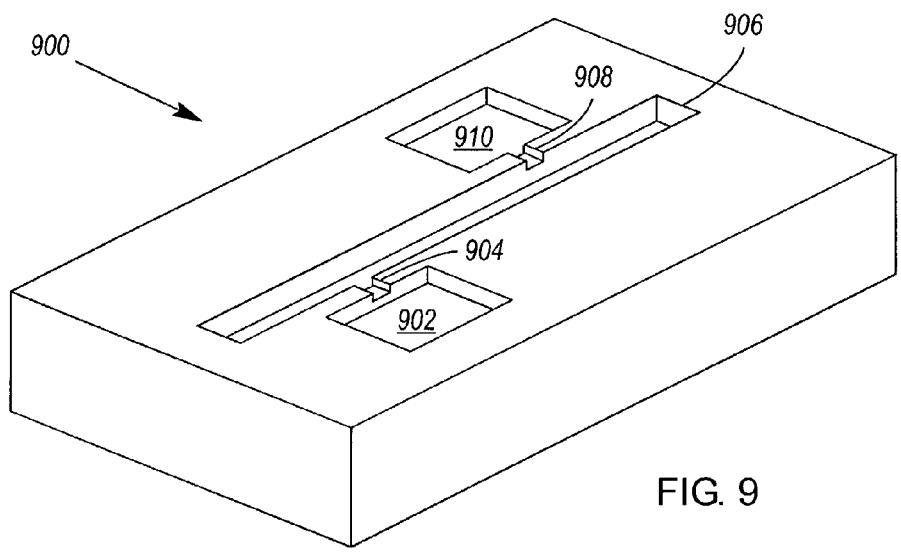
FIG. 9
FIG. 10
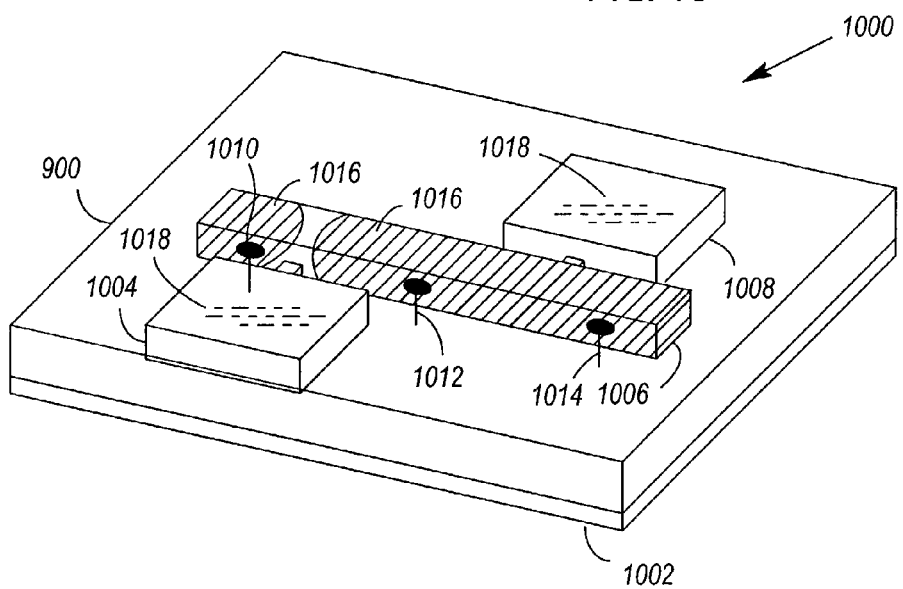

FEATURE FORMATION IN THICK-FILM INKS

BACKGROUND

It is sometimes necessary to form a feature or features in a thick-film ink (or "slurry") deposited on a substrate. One way to do this is by screen printing the features. With screen printing, a screen having the features formed therein is placed over the substrate, and the thick-film ink is deposited on the substrate through the screen. Another way to form features in a thick-film ink is to stencil print the features. With stencil printing, a stencil having the features formed therein is placed over the substrate, and the thick-film ink is deposited on the substrate through the stencil. While screen printing is typically better suited to the deposition of relatively thinner thick-films, stencil printing typically offers better release characteristics when depositing relatively thicker thick-films. However, each of these processes is limited in the types of features it can be used to produce— especially in a micro or sub-micro environment.

Some of the limiting factors of screen and stencil printing processes include larger than desired feature alignment tolerances, feature width tolerances, and feature thickness tolerances. Larger than desired feature alignment and feature width tolerances can result, for example, from screen and stencil deflection, screen and stencil manufacturing tolerances, screen and stencil instability, slumping of the thick-film ink before and during cure, edge effects at feature edges from the wire mesh of a screen stencil, and nonuniformities in the screen and stencil printing processes as a whole. Larger than desired feature thickness tolerances can result, for example, from wire mesh removal dynamics, thick-film ink slumping and shrinkage, and nonuniformities in the screen and stencil printing processes as a whole.

SUMMARY OF THE INVENTION

One aspect of the invention is embodied in a method for forming one or more features in a thick-film ink deposited on a substrate. As part of the method, a photoimagable material is used to define a negative of the one or more features on the substrate. A thick-film ink is then deposited on at least part of the substrate, abutting at least some of the photoimagable material. Thereafter, the thick-film ink is cured, and the photoimagable material is removed.

Another aspect of the invention is embodied in a channel plate. The channel plate is produced by using a photoimagable material to define a negative of one or more channels on a substrate, and then depositing a thick-film ink on at least part of the substrate, abutting at least some of the photoimagable material. Thereafter, the thick-film ink is cured, and the photoimagable material is removed to form the one or more channels.

Yet another aspect of the invention is embodied in a switch. The switch is produced by using a photoimagable material to define a negative of one or more channels on a substrate, and then depositing a thick-film ink on at least part of the substrate, abutting at least some of the photoimagable material. Thereafter, the thick-film ink is cured, and the photoimagable material is removed to create a channel plate. The one or more channels in the channel plate are then aligned with at least one feature on a substrate, and at least a switching fluid is sealed between the channel plate and the substrate.

Other embodiments of the invention are also disclosed.

BRIEF DESCRIPTION OF THE DRAWINGS

Illustrative embodiments of the invention are illustrated in the drawings, in which:

FIG. 9 illustrates an exemplary channel plate;

FIG. 10 illustrates a first exemplary embodiment of a switch;

DETAILED DESCRIPTION OF THE INVENTION

Figure 1:
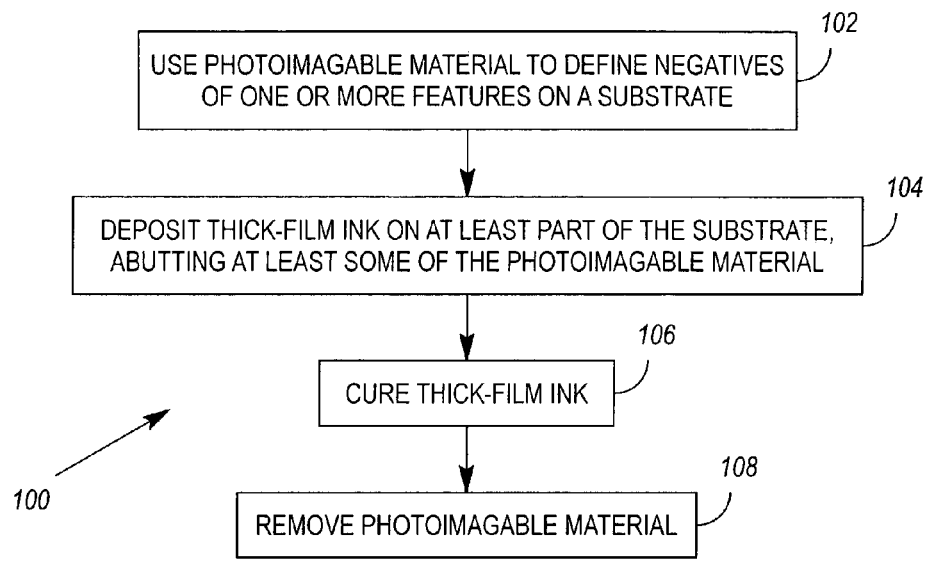
FIG. 1 illustrates a method for forming one or more features in a thick-film ink.

FIG. 1 illustrates a method 100 for forming one or more features (e.g., channels) in a thick-film ink (or "slurry") deposited on a substrate. The method 100 commences with the use 102 of a photoimagable material to define negatives of the features on the substrate. One way to define the feature negatives is shown in FIG. 2.

Figure 2:
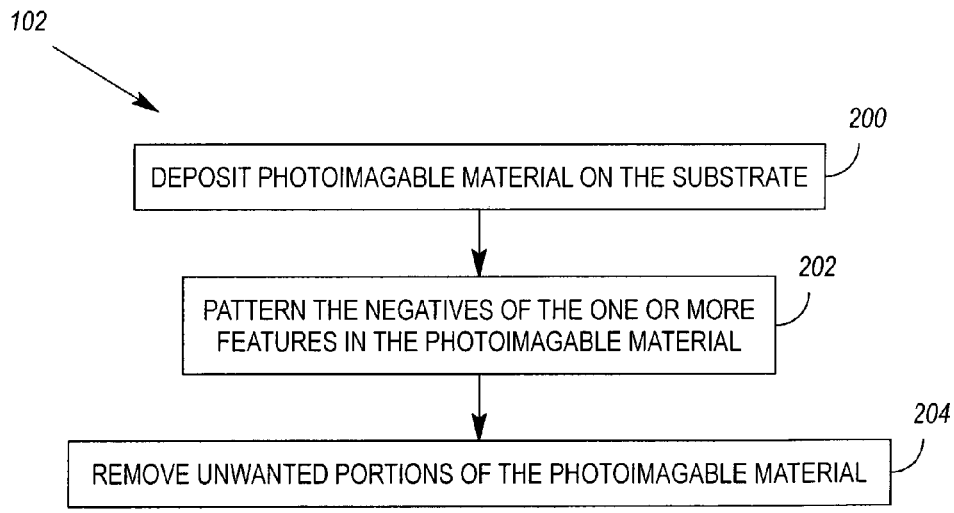
FIG. 2 illustrates a method for defining feature negatives in a photoimagable material.

According to FIG. 2, the photoimagable material is first deposited 200 on the substrate (e.g., by means of spin coating, spray coating or doctor blading). The feature negatives are then patterned 202 in the photoimagable material (e.g., by positioning a negative feature mask over the photoimagable material, and then exposing the photoimagable material to light or radiation through the mask). Unwanted portions of the photoimagable material may then be removed by means of, for example, a developing or etching process. Note, however, that depending on the type of photoimagable material and type of patterning process used, a separate material removal step may be unnecessary due to disintegration and/or vaporization of the unwanted portions of the photoimagable material.

If necessary, the photoimagable material may be cured before or after various stages of the above process. For example, the photoimagable material may be partially or fully cured prior to patterning, subsequent to patterning, or subsequent to developing. Curing may be achieved by exposing the photoimagable material to ambient conditions for a period of time, by heating the photoimagable material, by submersing the photoimagable material in an appropriate solution, or by other means.

By way of example, the photoimagable material may be a dry film or viscous liquid. These materials may be patterned with a fine granularity, thereby enabling the precise location of feature edges, and allowing smaller features to be defined. Dry films also provide for very good thickness control.

Following use of the photoimagable material to define feature negatives, a thick-film ink is deposited 104 on at least part of the substrate, abutting at least some of the photoimagable material. See FIG. 1. In some cases, the photoimagable material may define cavities that are filled with the thick-film ink, and in other cases, the photoimagable material may define open-ended channels or the like into which the thick-film ink is deposited.

The thick-film ink may be deposited in a variety of ways. For example, the thick-film ink may be deposited by means of spin-coating, curtain-coating, stencil printing, screen printing, or doctor blading. Some deposition processes may result in the thick-film ink having a depth that is equal to (or possibly even less than) the depth of the photoimagable material. Other deposition processes may result in the thick-film ink having a depth that is greater than the depth of the photoimagable material. In fact, the thick-film ink may even cover the photoimagable material. If this is the case, chemical-mechanical planarization, grinding, lapping, polishing, or other means may be used to adjust the thickness of the thick-film ink (possibly removing some of the photoimagable material in the process).

By way of example, the thick-film ink may be a glass, ceramic, or polymer-based thick film.

Following deposition of the thick-film ink, the thick-film ink is cured 106, and the photoimagable material is removed 108 (FIG. 1). The order of these steps depends on the compositions of the photoimagable material and thick-film ink used and, thus, the photoimagable material may be removed prior to, during, or after the thick-film ink is cured.

In some cases, curing the thick-film ink may only comprise drying the thick-film ink (e.g., by exposing it to ambient conditions or heating it for a period of time), or submersing the photoimagable material in an appropriate solution. However, in most cases, curing the thick-film ink will comprise firing the thick-film ink at a high temperature.

Methods for removing the photoimagable material include developing, etching, or burnout. The latter can be used, for example, when the composition of the photoimagable material is such that it will combust or vaporize as the thick-film ink is fired.

Optionally, the thickness of the thick-film ink may be adjusted by removing a portion of the thick-film ink subsequent to curing the thick-film ink. This may be accomplished by means of chemical-mechanical planarization, grinding, lapping, or polishing, for example.

If desired, the method 100 may be repeated to form another feature (or set of features) in another thick-film ink that is deposited on top of the existing thick-film ink. In this manner, it is possible to form exceptionally deep features, or features with non-constant characteristics in the thickness direction. For example, features could be formed in thick-film layers of differing thickness, or features could be formed in thick-film layers having different compositions.

Additional thick-film ink feature layers may also be formed by repeating FIG. 1's defining, depositing and curing steps prior to removal of the first-applied photoimagable material.

Figure 3:
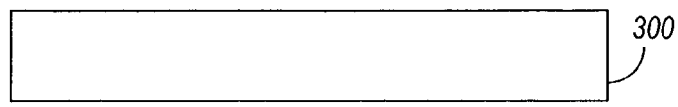
FIG. 3 illustrates an exemplary cross-section of a substrate.
Figure 4:
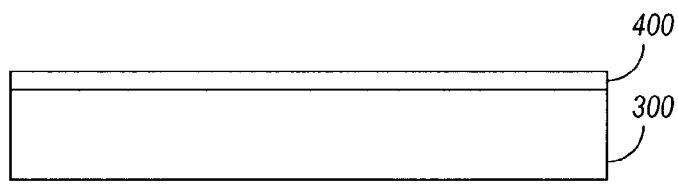
FIG. 4 illustrates the deposition of a photoimagable material on the FIG. 3 substrate.
Figure 5:
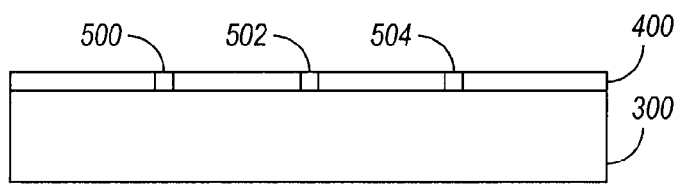
FIG. 5 illustrates the patterning of feature negatives in the photoimagable material deposited on the substrate in FIG. 4.
Figure 6:
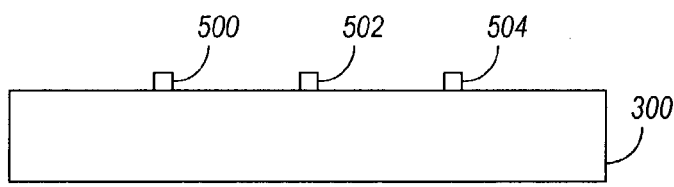
FIG. 6 illustrates the removal of unwanted portions of the photoimagable material shown in FIG. 5.
Figure 7:
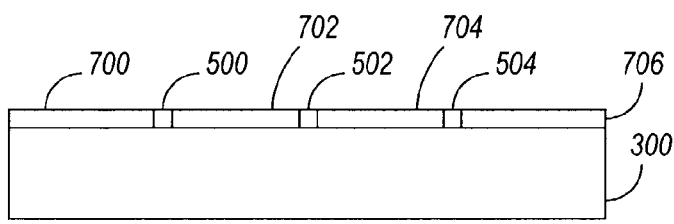
FIG. 7 illustrates the deposition of a thick-film ink abutting the feature negatives shown in FIG. 6.
Figure 8:
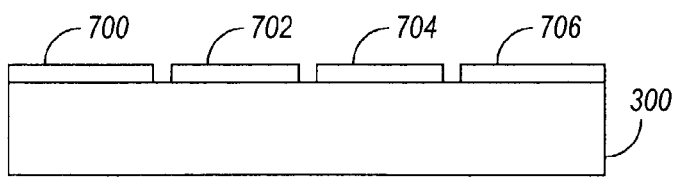
FIG. 8 illustrates the removal of the photoimagable material shown in FIG. 7, to expose features formed in a thick-film ink.

FIGS. 3–8 illustrate an exemplary application of the FIG. 1 method. FIG. 3 illustrates a substrate 300. In FIG. 4, a photoimagable material 400 is deposited on the substrate 300. In FIG. 5, the photoimagable material 400 is patterned to define feature negatives 500, 502, 504. FIG. 6 illustrates the feature negatives 500-504 after unwanted portions of the photoimagable material have been removed (e.g., by etching or developing the unwanted portions away). FIG. 7 illustrates the deposition of a thick-film ink 700, 702, 704, 706 such that it abuts the feature negatives 500–504. And, finally, FIG. 8 illustrates removal of the photoimagable material 500, 502, 504 to expose the features 700–706 formed in the thick-film ink.

The FIG. 1 method has a variety of useful applications. One application is the formation of channel plates such as that which is shown in FIG. 9. FIG. 9 illustrates a channel plate 900 in which a plurality of channels 902, 904, 906, 908, 910 have been formed. In one embodiment, the channel plate 900 is produced by forming all of the channels 902–910 in accordance with the teachings of method 100. In another embodiment, the channel plate 900 is produced by forming only some of its channels in accordance with the teachings of method 100 (e.g., only the small channels 904, 908). For the purpose of this description, a "channel" is defined to be any sort of groove, trough, pit or other feature that creates a recess extending below the uppermost surface of a channel plate 900.

Figure 13:
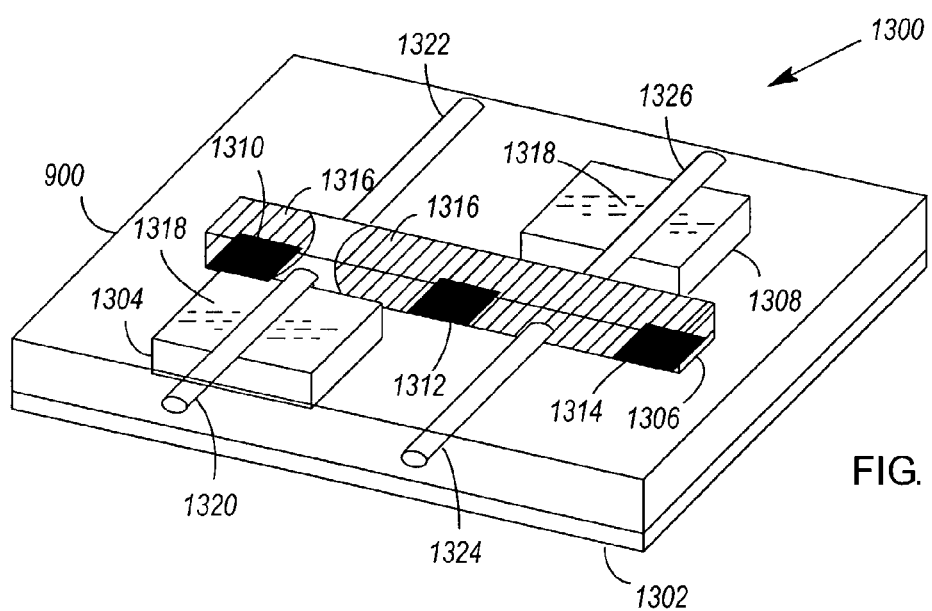
FIG. 13 illustrates a second exemplary embodiment of a switch.

The channel plate 900 may be used in the manufacture of fluid-based switches such as liquid metal micro switches (LIMMS). FIGS. 10 & 13 therefore illustrate switches that might incorporate a channel plate such as that which is shown in FIG. 9.

FIG. 10 illustrates a first exemplary embodiment of a switch 1000. The switch 1000 comprises a channel plate 900 defining at least a portion of a number of cavities 1004, 1006, 1008. The remaining portions of the cavities 1004–1008, if any, may be defined by a substrate 1002 to which the channel plate 900 is mated and sealed. Exposed within one or more of the cavities are a plurality of electrodes 1010, 1012, 1014. A switching fluid 1016 (e.g., a conductive liquid metal such as mercury) held within one or more of the cavities serves to open and close at least a pair of the plurality of electrodes 1010–1014 in response to forces that are applied to the switching fluid 1016. An actuating fluid 1018 (e.g., an inert gas or liquid) held within one or more of the cavities serves to apply the forces to the switching fluid 1016.

In one embodiment of the switch 1000, the forces applied to the switching fluid 1016 result from pressure changes in the actuating fluid 1018. The pressure changes in the actuating fluid 1018 impart pressure changes to the switching fluid 1016, and thereby cause the switching fluid 1016 to change form, move, part, etc. In FIG. 10, the pressure of the actuating fluid 1018 held in cavity 1004 applies a force to part the switching fluid 1016 as illustrated. In this state, the rightmost pair of electrodes 1012, 1014 of the switch 1000 are coupled to one another. If the pressure of the actuating fluid 1018 held in cavity 1004 is relieved, and the pressure of the actuating fluid 1018 held in cavity 1008 is increased, the switching fluid 1016 can be forced to part and merge so that electrodes 1012 and 1014 are decoupled and electrodes 1010 and 1012 are coupled.

By way of example, pressure changes in the actuating fluid 1018 may be achieved by means of heating the actuating fluid 1018, or by means of piezoelectric pumping. The former is described in U.S. Pat. No. 6,323,447 of Kondoh et al. entitled "Electrical Contact Breaker Switch, Integrated Electrical Contact Breaker Switch, and Electrical Contact Switching Method". The latter is described in U.S. patent application Ser. No. 10/137,691 of Marvin Glenn Wong filed May 2, 2002 and entitled "A Piezoelectrically Actuated Liquid Metal Switch". Although the above referenced patent and patent application disclose the movement of a switching fluid by means of dual push/pull actuating fluid cavities, a single push/pull actuating fluid cavity might suffice if significant enough push/pull pressure changes could be imparted to a switching fluid from such a cavity. In such an arrangement, the channel plate for the switch could be constructed similarly to the channel plate 900 disclosed herein.

The channel plate 900 of the switch 1000 may have a plurality of channels 902–910 formed therein, as illustrated in FIG. 9. In one embodiment of the switch 1000, the first channel 906 in the channel plate 900 defines at least a portion of the one or more cavities 1006 that hold the switching fluid 1016. By way of example, this switching fluid channel 906 may have a width of about 200 microns, a length of about 2600 microns, and a depth of about 200 microns.

A second channel or channels 902, 910 may be formed in the channel plate 900 so as to define at least a portion of the one or more cavities 1004, 1008 that hold the actuating fluid 1018. By way of example, these actuating fluid channels 902, 910 may each have a width of about 350 microns, a length of about 1400 microns, and a depth of about 300 microns.

A third channel or channels 904, 908 may be formed in the channel plate 900 so as to define at least a portion of one or more cavities that connect the cavities 1004–1008 holding the switching and actuating fluids 1016, 1018. By way of example, the channels 904, 908 that connect the actuating fluid channels 902, 910 to the switching fluid channel 906 may each have a width of about 100 microns, a length of about 600 microns, and a depth of about 130 microns.

The one or more channels 902–910 in the channel plate 900 may be aligned with one or more features on the substrate 1002, and the channel plate 900 may then be sealed to the substrate 1002, by means of an adhesive or gasket material, for example. One suitable adhesive is Cytop™ (manufactured by Asahi Glass Co., Ltd. of Tokyo, Japan). Cytop™ comes with two different adhesion promoter packages, depending on the application. When a channel plate 900 has an inorganic composition, Cytop™'s inorganic adhesion promoters should be used. Similarly, when a channel plate 900 has an organic composition, Cytop™'s organic adhesion promoters should be used.

Figure 11:
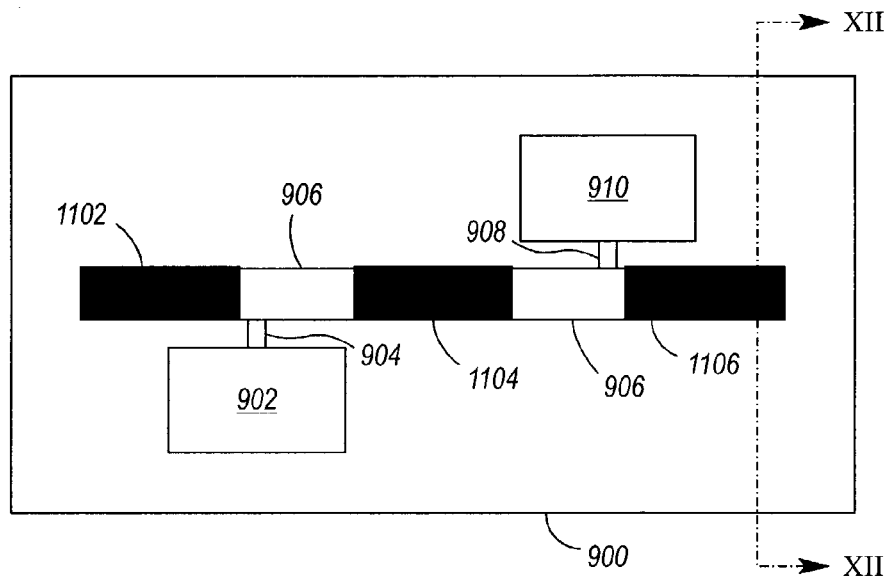
FIGS. 11 & 12 illustrate the deposition of seal belts on the FIG. 9 channel plate.
Figure 12:
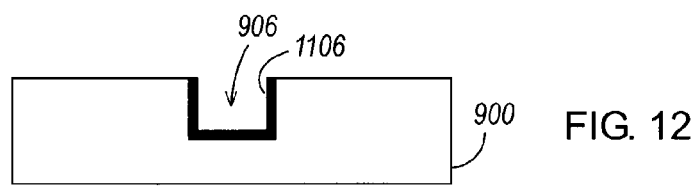

Optionally, and as illustrated in FIGS. 11 & 12, portions of a channel plate 900 may be metallized (e.g., via sputtering or evaporating through a shadow mask, or via etching through a photoresist) for the purpose of creating "seal belts" 1102, 1104, 1106. The creation of seal belts 1102–1106 within a switching fluid channel 906 provides additional surface areas to which a switching fluid may wet. This not only helps in latching the various states that a switching fluid can assume, but also helps to create a sealed chamber from which the switching fluid cannot escape, and within which the switching fluid may be more easily pumped (i.e., during switch state changes).

Additional details concerning the construction and operation of a switch such as that which is illustrated in FIG. 10 may be found in the afore-mentioned patent of Kondoh et al. and patent application of Marvin Glenn Wong.

FIG. 13 illustrates a second exemplary embodiment of a switch 1300. The switch 1300 comprises a channel plate 900 defining at least a portion of a number of cavities 1304, 1306, 1308. The remaining portions of the cavities 1304–1308, if any, may be defined by a substrate 1302 to which the channel plate 900 is sealed. Exposed within one or more of the cavities are a plurality of wettable pads 1310–1314. A switching fluid 1316 (e.g., a liquid metal such as mercury) is wettable to the pads 1310-1314 and is held within one or more of the cavities. The switching fluid 1316 serves to open and block light paths 1320/1322, 1324/1326 through one or more of the cavities, in response to forces that are applied to the switching fluid 1316. By way of example, the light paths may be defined by waveguides 1320–1326 that are aligned with translucent windows in the cavity 1306 holding the switching fluid. Blocking of the light paths 1320/1322, 1324/1326 may be achieved by virtue of the switching fluid 1316 being opaque. An actuating fluid 1318 (e.g., an inert gas or liquid) held within one or more of the cavities serves to apply the forces to the switching fluid 1316.

Forces may be applied to the switching and actuating fluids 1316, 1318 in the same manner that they are applied to the switching and actuating fluids 1016, 1018 in FIG. 10.

The channel plate 900 of the switch 1300 may have a plurality of channels 902–910 formed therein, as illustrated in FIG. 9. In one embodiment of the switch 1300, the first channel 906 in the channel plate 900 defines at least a portion of the one or more cavities 1306 that hold the switching fluid 1316.

A second channel or channels 902, 910 may be formed in the channel plate 900 so as to define at least a portion of the one or more cavities 1304, 1308 that hold the actuating fluid 1318.

A third channel or channels 904, 908 may be formed in the channel plate 900 so as to define at least a portion of one or more cavities that connect the cavities 1304–1308 holding the switching and actuating fluids 1316, 1318.

Additional details concerning the construction and operation of a switch such as that which is illustrated in FIG. 13 may be found in the afore-mentioned patent of Kondoh et al. and patent application of Marvin Glenn Wong. Furthermore, an adhesive or gasket layer, as well as seal belts, may be applied to the switch's channel plate 900 as described supra, and as shown in FIGS. 11 & 12.

The use of channel plates is not limited to the switches 1000, 1300 disclosed in FIGS. 10 & 13 and may be undertaken with other forms of switches that comprise, for example, 1) a channel plate defining at least a portion of a number of cavities, a first of which is at least partially defined by a thick-film as disclosed in FIG. 1, and 2) a switching fluid, held within one or more of the cavities, that is movable between at least first and second switch states in response to forces that are applied to the switching fluid. The patent of Kondoh, et al. and patent application of Marvin Glenn Wong that were previously incorporated by reference disclose liquid metal micro switches (LIMMS) that meet this description.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for forming a switch, comprising:
    a) using a photoimagable material to define negatives of one or more channels on a substrate;
    b) depositing a thick-film ink on at least part of the substrate, abutting at least some of the photoimagable material;
    c) curing the thick-film ink;
    d) removing the photoimagable material to create a channel plate; and
    e) aligning the one or more channels in the channel plate with at least one feature on a substrate, and sealing at least a switching fluid between the channel plate and the substrate.

2. The method of claim 1, wherein using the photoimagable material to define a negative of the one or more channels, comprises:
   a) depositing the photoimagable material on the substrate;
   b) patterning the negative of the one or more channels in the photoimagable material; and
   c) removing unwanted portions of the photoimagable material.

3. The method of claim 1, wherein the photoimagable material is deposited as a dry film.

4. The method of claim 1, wherein the photoimagable material is deposited as a liquid.

5. The method of claim 1, wherein the thick-film ink is deposited by means of spin-coating.

6. The method of claim 1, wherein the thick-film ink is deposited by means of curtain-coating.

7. The method of claim 1, wherein the thick-film ink is deposited by means of doctor blading.

8. The method of claim 1, wherein the thick-film ink is deposited by means of screen printing.

9. The method of claim 1, wherein the thick-film ink is deposited by means of stencil printing.

10. The method of claim 1, wherein curing the thick-film ink comprises drying the thick-film ink.

11. The method of claim 1, wherein curing the thick-film ink comprises firing the thick-film ink.

12. The method of claim 1, wherein the photoimagable material is removed prior to said curing.

13. The method of claim 1, wherein the photoimagable material is removed during said curing.

14. The method of claim 1, wherein the photoimagable material is removed after said curing.

15. The method of claim 1, further comprising, adjusting a thickness of the thick-film ink, subsequent to curing the thick-film ink, by removing a portion of the thick-film ink.

16. The method of claim 1, further comprising, repeating said defining, depositing, curing and removing actions to form another channel in another thick-film ink that is deposited on top of the existing thick-film ink.

17. The method of claim 1, further comprising, prior to removing the photoimagable material, repeating said defining, depositing and curing actions to form another channel in another thick-film ink that is deposited on top of the existing thick-film ink.

18. The method of claim 1, further comprising:
   depositing a plurality of electrodes in the one or more channels on the substrate; and
   depositing the switching fluid on the electrodes.

19. The method of claim, further comprising:
   depositing a plurality of wettable pads in the one or more channels on the substrate; and
   depositing the switching fluid on the wettable pads.

* * * * *

UNITED STATES PATENT AND TRADEMARK OFFICE
CERTIFICATE OF CORRECTION

| | | |
|---|---|---|
| PATENT NO. | : 7,070,908 B2 | Page 1 of 1 |
| APPLICATION NO. | : 10/413854 | |
| DATED | : July 4, 2006 | |
| INVENTOR(S) | : Wong | |

It is certified that error appears in the above-identified patent and that said Letters Patent is hereby corrected as shown below:

On the Title page, in item (56), under "U.S. Patent Documents", in column 1, line 2, delete "2,564,071" and insert -- 2,564,081 --, therefor.

Column 8, line 22, in Claim 19, delete "claim," and insert -- claim 1, --, therefor.

Signed and Sealed this

Twelfth Day of December, 2006

JON W. DUDAS
*Director of the United States Patent and Trademark Office*